(12) United States Patent
Byun

(10) Patent No.: US 7,283,415 B2
(45) Date of Patent: Oct. 16, 2007

(54) APPARATUS FOR CONTROLLING ACTIVATION PERIOD OF WORD LINE OF VOLATILE MEMORY DEVICE AND METHOD THEREOF

(75) Inventor: Hee Jin Byun, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 139 days.

(21) Appl. No.: 11/111,249

(22) Filed: Apr. 21, 2005

(65) Prior Publication Data

US 2006/0171216 A1 Aug. 3, 2006

(30) Foreign Application Priority Data

Feb. 2, 2005 (KR) .................. 10-2005-0009602

(51) Int. Cl.
*G11C 7/00* (2006.01)
*G11C 8/00* (2006.01)

(52) U.S. Cl. .................. 365/222; 365/194; 365/230.05

(58) Field of Classification Search ................ 365/222, 365/194, 230.05, 230.06
See application file for complete search history.

(56) References Cited

U.S. PATENT DOCUMENTS 6,269,041 B1 * 7/2001 Wang et al. ................ 365/222
6,542,426 B2 * 4/2003 Jung et al. .................. 365/222
6,765,839 B2 * 7/2004 Park ............................ 365/222

FOREIGN PATENT DOCUMENTS

KR 10-2003-0082723 10/2003

* cited by examiner

*Primary Examiner*—Son Dinh
(74) *Attorney, Agent, or Firm*—Ladas & Parry LLP

(57) ABSTRACT

An apparatus for controlling an activation period of a word line of a volatile memory device is disclosed. The apparatus adjusts the activation period of the word line using a member for adjusting a pulse width of a pulse signal that activates the word line according to an operation mode of the volatile memory device.

8 Claims, 3 Drawing Sheets

APPARATUS FOR CONTROLLING ACTIVATION PERIOD OF WORD LINE OF VOLATILE MEMORY DEVICE AND METHOD THEREOF

BACKGROUND OF THE INVENTION

1. Field of the Invention

The present invention relates to an apparatus for controlling an activation period of a word line of a volatile memory device and a method thereof, an more particularly to an apparatus for controlling an activation period of a word line of a volatile memory device and a method thereof that can make the activation period of the word line different according to an operation mode of the volatile memory device.

2. Description of the Prior Art

As is well known, a volatile memory device (hereinafter referred to as a memory device) performs a refresh operation for a predetermined time in order to prevent loss of data stored in memory cells.

The refresh operation is classified into an auto-refresh operation that is performed by an external command and a self-refresh operation that is performed in the memory device itself. The present invention specially refers to the self-refresh operation.

Generally, the self-refresh operation is as follows.

If a self-refresh flag signal that indicates the self-refresh operation is enabled, an address signal is generated by an internal counter circuit of the memory device, and a word line corresponding to the generated address signal is activated.

If the word line is activated, a charge sharing occurs between the memory cell and a bit line, and the potential level on the bit line is changed.

A sense amplifier that has sensed the level change on the bit line amplifies and restores the level change in the memory cell. If the restoring operation is completed, the word line is inactivated and the bit line is precharged by an auto-precharge command.

As described above, during the self-refresh operation, the word line is activated for a predetermined time. Here, the time period in which the word line is activated is necessary for restoring the data in the memory cell. The activation of the word line for the predetermined time is performed in the same manner in a normal operation such as a read operation.

Meanwhile, it is not required that the time period in which the word line is activated in a self-refresh mode is equal to the time period in which the word line is activated in a normal operation mode. This is because although the minimum time period, in which the word line should be kept activated due to a data processing speed and so on, has been determined by a specification of the memory device in the normal operation mode, the time period for the word line activation in the self-refresh mode may be lengthened in comparison to that in the normal operation mode since the safe restoring of the data in the memory cell is more important than the data processing speed in the self-refresh mode.

However, the conventional apparatus for controlling the activation period of the word line outputs a pulse signal having a constant pulse width irrespective of the operation mode of the memory device. Accordingly, the same time period for the word line activation is provided irrespective of the operation mode.

Generally, if the characteristic of the memory cell is good, it is no hindrance to set the word line activation period to a constant value irrespective of the operation mode.

However, if the characteristic of the memory cell is not good, the situation changes. This is because if the characteristic of the memory cell is not good, a sufficient time period for restoring the data in the memory cell is required.

This will now be explained in more detail with reference to FIGS. 1a and 1b.

FIGS. 1a and 1b are views explaining the characteristics of the memory cell and the memory cell transistor. In FIG. 1a, the term "ln(Id)" denotes a drain current, and "Vgs" denotes a gate-source voltage of the transistor.

As illustrated in FIG. 1b, in the case of the characteristic A of the memory cell transistor, data can be restored within a specified time period t1, but in the case of the characteristic B of the memory cell transistor, the time period t1 is insufficient to complete the restoring of the data. That is, as shown in FIG. 1b, in the case of the characteristic B of the memory cell transistor, a specified time period t2 is required to restore the data. Accordingly, in consideration of the characteristics of the memory cell transistor, it is necessary to control the activation period of the word line according to the operation mode of the memory device.

However, the conventional apparatus has the drawbacks in that since the activation period of the word line is constant irrespective of the operation mode of the memory device, it is difficult to control the time period required to restore the data according to the operation mode or the characteristic of the memory cell.

SUMMARY OF THE INVENTION

Accordingly, the present invention has been made to solve the above-mentioned problems occurring in the prior art, and an object of the present invention is to provide an apparatus for controlling an activation period of a word line of a volatile memory device and a method thereof that can control the activation period of the word line according to an operation mode of the volatile memory device.

The present invention provides a scheme for stably restoring the data even if the characteristic of a memory cell transistor is not good by lengthening the activation period of the word line during a self-refresh operation.

In a first embodiment of the present invention, there is provided an apparatus for controlling an activation period of a word line of a volatile memory device, which adjusts the activation period of the word line using means for adjusting a pulse width of a pulse signal that activates the word line according to an operation mode of the volatile memory device.

In the first embodiment of the present invention, the activation period of the word line in the case in which the operation mode is a refresh mode is longer than the activation period of the word line in the case in which the operation mode is a normal mode.

In the first embodiment of the present invention, the means for adjusting the pulse width of the pulse signal is used to activate the word line by selecting one of first and second pulse signals that have pulse widths different from each other. Here, the second pulse signal is selected in the case in which the operation mode is the refresh mode and the first pulse signal is selected in the case in which the operation mode is the normal mode, and the activation period of the second pulse signal is longer than the activation period of the first pulse signal.

In a second embodiment of the present invention, there is provided a method of controlling an activation period of a word line of a volatile memory device, which adjusts the activation period of the word line by adjusting a pulse width of a pulse signal that activates the word line according to an operation mode of the volatile memory device.

In the second embodiment of the present invention, the activation period of the word line in the case in which the operation mode is a refresh mode is longer than the activation period of the word line in the case in which the operation mode is a normal mode.

In a third embodiment of the present invention, there is provided an apparatus for controlling an activation period of a word line of a volatile memory device, which comprises a first skewed delay unit for receiving a first pulse signal for activating the word line and outputting a second pulse signal having a pulse width different from a pulse width of the first pulse signal, a second skewed delay unit for receiving the second pulse signal and outputting a third pulse signal having a pulse width different from that of the second pulse signal, and a switching unit for selecting one of the second pulse signal and the third pulse signal.

In the third embodiment of the present invention, the second or third pulse signal that passes through the switching unit is a signal for activating the word line. Here, the pulse width of the third pulse signal is wider than the pulse width of the second pulse signal, and the pulse width of the second pulse signal is wider than the pulse width of the first pulse signal. The word line is activated during a pulse width period of the third pulse signal or a pulse width period of the second pulse signal. Additionally, if an operation mode of the volatile memory device is a normal mode, the word line is activated by the second pulse signal, and if the operation mode of the volatile memory device is a refresh mode, the word line is activated by the third pulse signal.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
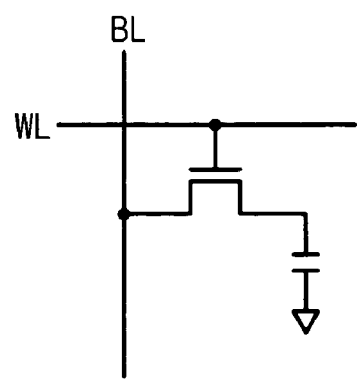
FIGS. 1a and 1b are views explaining the characteristics of the memory cell and the memory cell transistor.
Figure 1B:
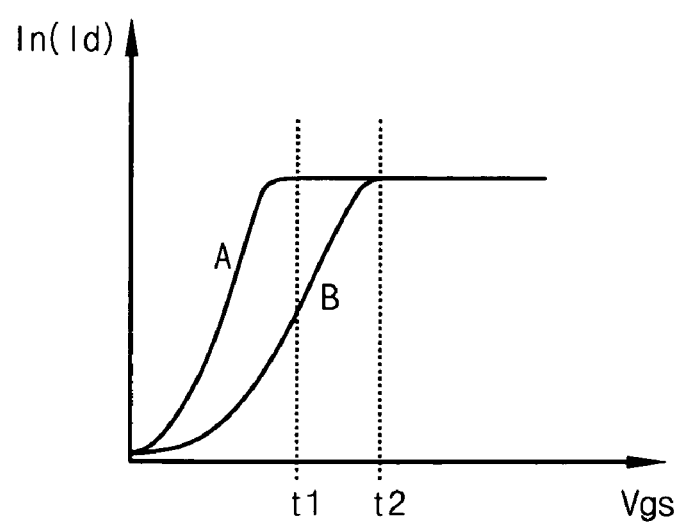

Hereinafter, preferred embodiments of the present invention will be described with reference to the accompanying drawings. In the following description and drawings, the same reference numerals are used to designate the same or similar components, and so repetition of the description on the same or similar components will be omitted.

Figure 2A:
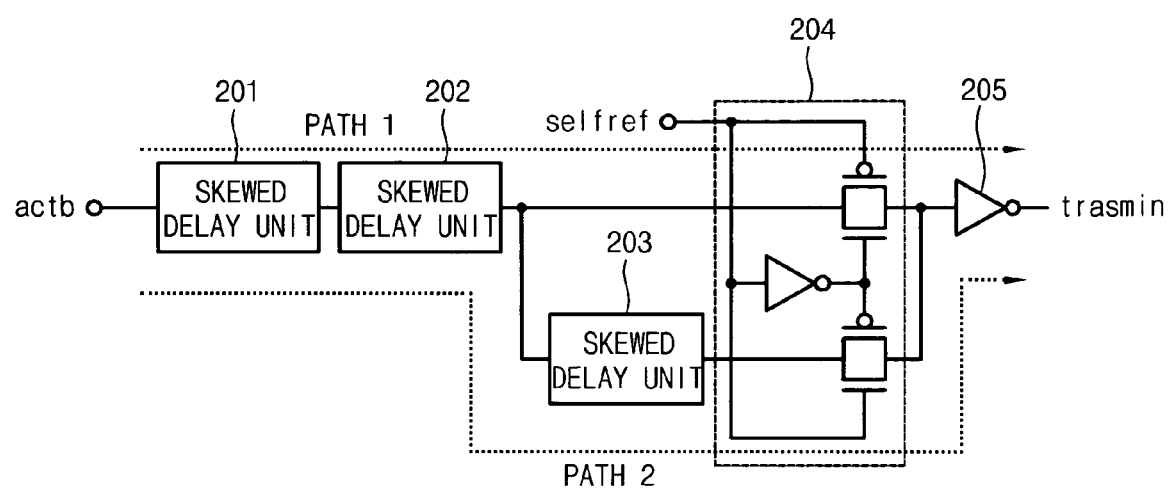
FIGS. 2a and 2b are views illustrating examples of the apparatus for controlling an activation period of a word line according to the present invention.
Figure 2B:
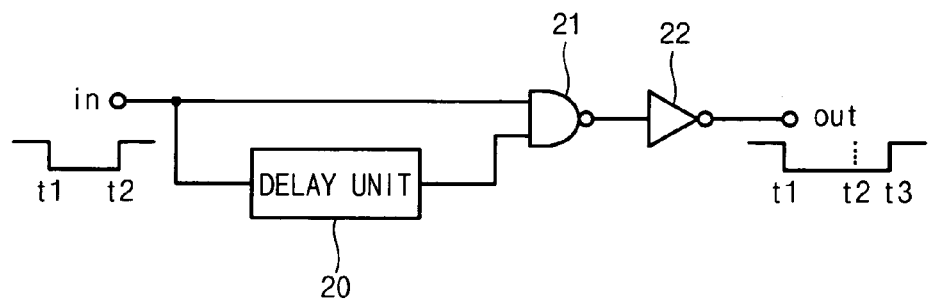
Figure 3A:
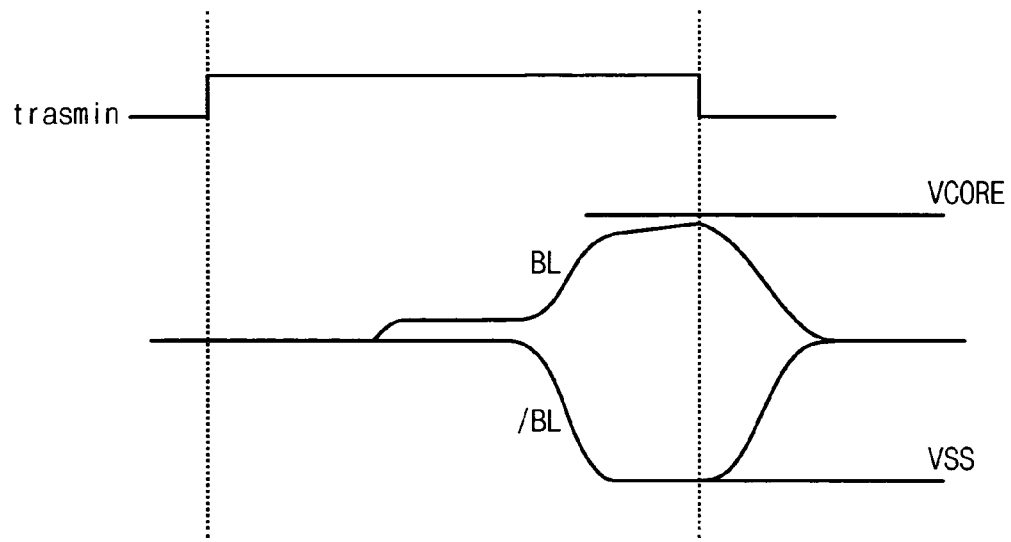
FIG. 3a is a view illustrating the potential level change of a signal trasmin for activating the word line and bit lines BL and /BL in the case in which the memory device is in a normal operation mode.
Figure 3B:
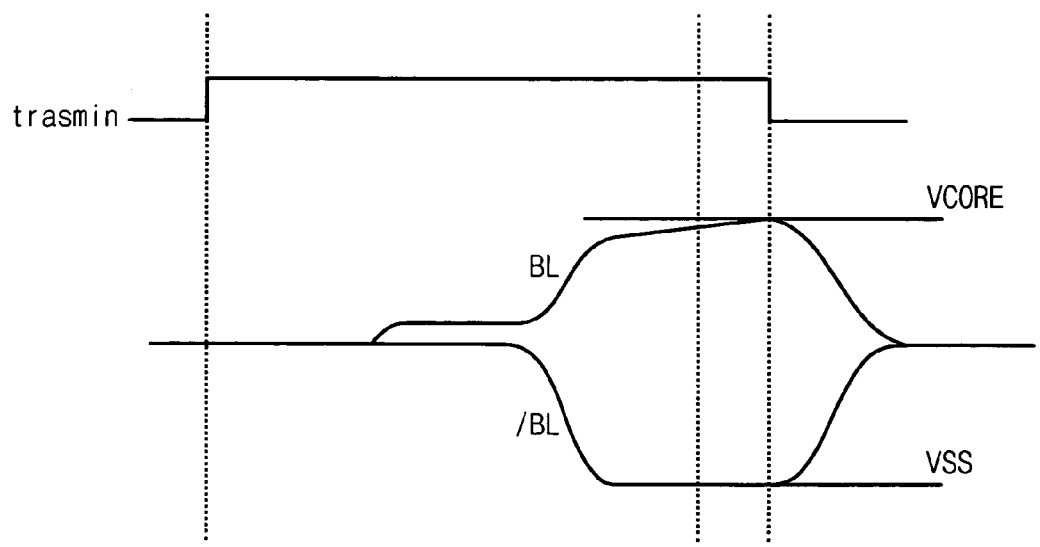
FIG. 3b is a view illustrating the potential level change of a signal trasmin for activating the word line and bit lines BL and /BL in the case in which the memory device is in a refresh operation mode.

FIGS. 2a and 2b are views illustrating examples of the apparatus for controlling an activation period of a word line according to the present invention. In FIG. 2a, a signal actb is a pulse signal that is generated by a row active signal caused by a normal operation or a refresh command and that is kept at a low level for a predetermined time. A signal trasmin is a signal for activating the word line of the memory device for a minimum period required for restoring the data so as to satisfy the refresh regulation. The waveform of the signal trasmin is illustrated in FIGS. 3a and 3b.

The control apparatus of FIG. 2a includes a skewed delay unit 201 for receiving the signal actb, a skewed delay unit 202 for receiving an output signal of the skewed delay unit 201, a skewed delay unit 203 for receiving an output signal of the skewed delay unit 202, a switching unit 204 for selecting and outputting one of the output signal of the skewed delay unit 202 and an output signal of the skewed delay unit 203, and a driving inverter 205 for receiving an output signal of the switching unit 204. For reference, the switching unit 204 is controlled by a control signal selfref. The control signal is a signal generated in response to the refresh command, and it is at a low level in case of the normal operation while it is at a high level in case of the refresh operation.

The skewed delay unit illustrated in FIG. 2a is a circuit for modulating the pulse width of the input signal, and its detailed construction is illustrated in FIG. 2b.

The skewed delay unit illustrated in FIG. 2b includes a delay unit 20 for receiving and delaying an input signal in for a predetermined time, a NAND gate 21 for receiving the input signal in and an output signal of the delay unit 20, and an inverter 22 for receiving an output signal of the NAND agate 21. An output signal out of the inverter 22 is the output signal of the skewed delay unit.

The skewed delay unit illustrated in FIG. 2b is a circuit for receiving a low-level pulse signal and outputting a pulse width modulated low-level pulse signal. The circuit of FIG. 2b is a circuit for increasing the pulse width of the input signal in, and those skilled in the art could diversely implement the pulse width modulation circuit having the same function as the circuit of FIG. 2b.

Hereinafter, the operation of the apparatus according to the present invention will be explained with reference to FIGS. 2a and 2b.

In the normal operation, the control signal selfref is at a low level, and the signal actb that is a low-level pulse signal is transferred through a path 1. That is, the signal actb is transferred to the inverter 205 via the skewed delay units 201 and 202. The pulse width of the output signal transmin of the inverter 205 is longer than the pulse width of the signal actb. This is because the pulse width of the input signal is modulated as the input signal passes through the skewed delay units 201 and 202 that are the pulse width modulation circuits for lengthening the pulse width of the input signal.

Then, in the refresh operation, the control signal selfref is at a high level, and the signal actb is transferred through a path 2. That is, the signal actb is transferred to the inverter 205 through the skewed delay units 201, 202 and 203. The pulse width of the output signal transmin of the inverter is longer than the pulse width of the signals actb. This is because the pulse width of the input signal is modulated as the input signal passes through the skewed delay units 201, 202 and 203 that are the pulse width modulation circuits for lengthening the pulse width of the input signal. As shown in the drawings, if the path 2 is selected, the skewed delay unit 203 is additionally connected to the circuit. Accordingly, the pulse width of the output signal trasmin in the case in which the path 2 is selected is longer than the pulse width of the output signal trasmin in the case in which the path 1 is selected.

As described above, since the pulse width of the signal trasmin in the case of the refresh operation is longer than the pulse width of the signal trasmin in the case of the normal operation, it can be recognized that the activation period of the word line can be lengthened in the case of the refresh operation.

FIG. 3a is a view illustrating the potential level change of the signal trasmin for activating the word line and bit lines BL and /BL in the case in which the memory device is in the normal operation mode, and FIG. 3b is a view illustrating the potential level change of the signal trasmin for activating the word line and bit lines BL and /BL in the case in which the memory device is in the refresh operation mode.

In FIGS. 3a and 3b, since the level change of the bit lines BL and /BL is caused by the operation of the sense amplifier as is well known in the art, any additional explanation thereof will be omitted. Meanwhile, the high-level period of the signal trasmin indicates the period in which the word line is activated.

If the characteristic of the memory cell transistor is good, the potential level of the bit line BL would rise up to a drive voltage level VCORE before the signal transmit is shifted to a low level. However, if the characteristic of the memory cell transistor is not good, the restoring operation may be performed in a state that the potential level does not rise up to the drive voltage level VCORE. In the normal operation such as the read operation, the minimum period in which the word line is activated is required due to the processing speed and so on, and thus the problem explained with reference to FIG. 3a may occur. However, in the refresh operation, the activation period of the word line could be lengthened without causing any problem. This will be explained with reference to FIG. 3b.

As illustrated in FIG. 3b, the pulse width of the signal trasmin for controlling the activation period of the word line is wider than that as illustrated in FIG. 3a. Accordingly, even if the characteristic of the memory cell transistor is somewhat lowered, a stable data restoring operation can be achieved.

The present invention provides a scheme for making the activation period of the word line different according to the operation mode of the volatile memory device, i.e., whether the memory device is in the normal mode or in the refresh mode.

As described above, according to the circuit for differently controlling the activation period of the word line according to the operation mode of the memory device according to the present invention, a stable restoring operation can be achieved even if the characteristic of the memory cell is not good.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An apparatus for controlling an activation period of a word line of a volatile memory device, the apparatus comprising:
    means for adjusting a pulse width of a pulse signal that activates the word line according to an operation mode of the volatile memory device,
    wherein the activation period of the word line is adjusted by using the means, and wherein the activation period of the word line in case the operation mode is a refresh mode is longer than the activation period of the word line in the case the operation mode is a normal mode.

2. The apparatus as claimed in claim 1, wherein the means for adjusting the pulse width of the pulse signal is used to activate the word line by selecting one of first and second pulse signals that have pulse widths different from each other.

3. The apparatus as claimed in claim 2, wherein the second pulse signal is selected in the case in which the operation mode is the refresh mode and the first pulse signal is selected in the case in which the operation mode is the normal mode; and
    wherein the activation period of the second pulse signal is longer than the activation period of the first pulse signal.

4. An apparatus for controlling an activation period of a word line of a volatile memory device, comprising:
    a first skewed delay unit for receiving a first pulse signal for activating the word line and outputting a second pulse signal having a pulse width different from a pulse width of the first pulse signal;
    a second skewed delay unit for receiving the second pulse signal and outputting a third pulse signal having a pulse width different from that of the second pulse signal; and
    a switching unit for selecting one of the second pulse signal and the third pulse signal,
    wherein if an operation mode of the volatile memory device is a normal mode, the word line is activated by the second pulse signal; and if the operation mode of the volatile memory device is a refresh mode, the word line is activated by the third pulse signal.

5. The apparatus as claimed in claim 4, wherein the second or third pulse signal that passes through the switching unit is a signal for activating the word line.

6. The apparatus as claimed in claim 5, wherein the pulse width of the third pulse signal is wider than the pulse width of the second pulse signal, and the pulse width of the second pulse signal is wider than the pulse width of the first pulse signal.

7. The apparatus as claimed in claim 6, wherein the word line is activated during a pulse width period of the third pulse signal or a pulse width period of the second pulse signal.

8. A method of controlling an activation period of a word line of a volatile memory device, comprising:
    the step of adjusting the activation period of the word line by adjusting a pulse width of a pulse signal that activates the word line according to an operation mode of the volatile memory device,
    wherein the activation period of the word line in the case in which the operation mode is a refresh mode is loner than the activation period of the word line in the case in which the operation mode is a normal mode.

* * * * *